(12) United States Patent
Suzuki et al.

(10) Patent No.: US 11,549,173 B2
(45) Date of Patent: Jan. 10, 2023

(54) SPUTTERING APPARATUS

(71) Applicant: ULVAC, INC., Kanagawa (JP)

(72) Inventors: Koji Suzuki, Kanagawa (JP); Hideto Nagashima, Kanagawa (JP); Yukihito Tashiro, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 0 days.

(21) Appl. No.: 17/504,012

(22) Filed: Oct. 18, 2021

(65) Prior Publication Data
US 2022/0145445 A1 May 12, 2022

(30) Foreign Application Priority Data

Nov. 12, 2020 (JP) .............................. JP2020-188813

(51) Int. Cl.
| C23C 14/34 | (2006.01) |
| H01J 37/34 | (2006.01) |
| C23C 14/56 | (2006.01) |
| C23C 14/54 | (2006.01) |

(52) U.S. Cl.
CPC ........ *C23C 14/3407* (2013.01); *C23C 14/541* (2013.01); *C23C 14/56* (2013.01); *H01J 37/3441* (2013.01)

(58) Field of Classification Search
CPC ... C23C 14/3407; C23C 14/541; C23C 14/56; C23C 14/34; C23C 14/564; C23C 14/50; H01J 37/3441; H01J 37/3447
USPC ........................ 204/298.09, 298.11; 118/724
See application file for complete search history.

(56) References Cited

U.S. PATENT DOCUMENTS

2018/0142340 A1* 5/2018 Johanson .......... H01J 37/32477
2018/0265968 A1* 9/2018 Vetter ............... H01J 37/32651

FOREIGN PATENT DOCUMENTS

| CN | 110670042 A | * | 1/2020 | |
| CN | 111235535 A | * | 6/2020 | ............. C23C 14/34 |
| JP | 2018-500317 A | | 7/2018 | |

OTHER PUBLICATIONS

CN-110670042-A Translation (Year: 2020).*
CN-111235535-A Translation (Year: 2020).*

* cited by examiner

*Primary Examiner* — James Lin
*Assistant Examiner* — Patrick S Ott
(74) *Attorney, Agent, or Firm* — Cermak Nakajima & McGowan LLP Tomoko Nakajima

(57) ABSTRACT

Provided is a sputtering apparatus which is capable of suppressing a local temperature rise at an outer peripheral part of a to-be-processed substrate. The sputtering apparatus SM has: a vacuum chamber in which a target and the to-be-processed substrate Sw are disposed face-to-face with each other; a shield plate for enclosing a film forming space between the target and the to-be-processed substrate; and a cooling unit for cooling the shield plate. The shield plate has a first shield plate part which is disposed around the to-be-processed substrate and which has a first opening equivalent in contour to the to-be-processed substrate. The cooling unit includes a first coolant passage which is disposed in the first shield plate part and which has a passage portion extending all the way to the first shield plate part positioned around the first opening.

6 Claims, 3 Drawing Sheets

SPUTTERING APPARATUS

This application claims priority under 35 U.S.C. § 119 to Japanese Patent Application No. 2020-188813, filed Nov. 12, 2020, both of which are incorporated by reference.

TECHNICAL FIELD

The present invention relates to a sputtering apparatus equipped with: a vacuum chamber in which a target and a substrate to be processed (hereinafter also referred to as "a to-be-processed substrate") are positioned face-to-face with each other; and shield plates which enclose, inside the vacuum chamber, a film forming space (film deposition space) between the target and the to-be-processed substrate.

BACKGROUND ART

This kind of sputtering apparatus is known, e.g., in patent document 1. In this apparatus the shield plate is made up of a first shield plate part (lower part portion) which is disposed around the to-be-processed substrate and which has a first opening equivalent in contour to the to-be-processed substrate so as to allow the to-be-processed substrate to face the film forming space; a second shield plate part (upper part portion) which is disposed around a target and which has a second opening equivalent in contour to the target so as to allow the target to face the film forming space; and an intermediate shield plate part (cylindrical part main body) which connects the first shield plate part and the second shield plate part together. Then in the intermediate shield plate part, there is formed a coolant passage (heat transmission channel) which is a constituting element of a cooling unit. By circulating a coolant such as cooling water and the like through the coolant passage, it is so arranged that the shield plate can be cooled during film forming by sputtering the target. By the way the temperature of the coolant is ordinarily set to a predetermined temperature (i.e., the temperature of 20° C. to 25° C.) at which condensation can be prevented from occurring according to the room temperature.

Now, when the target is defined, e.g., to be made of aluminum, and an aluminum film is formed on the surface of the to-be-processed substrate by using the above-mentioned conventional sputtering apparatus, it has been found that the quality of the aluminum film in the in-plane direction of the to-be processed substrate becomes non-uniform. Then, the inventors of this invention have made strenuous efforts and have obtained the following findings as described hereinbelow. Even if an effort was made, as in the above-mentioned conventional example, to try to flow the coolant at the above-mentioned temperature, during film forming, through the coolant passage in the intermediate shield plate part so as to cool the entire shield plate through heat transmission, in the first shield plate part, the heat input from the plasma that was generated in the film forming space during film forming became predominant. As a result, the temperature of the first shield plate part rose to a relatively high temperature. Particularly that the peripheral part of the first opening which was the farthest from the intermediate shield plate part became the highest in temperature. Then, gases such as water molecules and oxygen molecules that were adsorbed in the surface of the first shield plate part were discharged therefrom. These discharged gases came to be easier to get captured into that outer peripheral part of the to-be-processed substrate which was positioned near the first opening. In addition thereto, as a result of local heating of the outer peripheral part of the to-be-processed substrate which was positioned near the first opening, the grain size locally increased in the outer peripheral part of the to-be-processed substrate. It was for these reasons that the film quality of the aluminum film became non-uniform.

PRIOR ART DOCUMENTS

Patent Documents

Patent Document 1: JP-T 2018-519426

SUMMARY

Problems that the Invention is to Solve

This invention has been made based on the above-mentioned findings and has a problem of providing a sputtering apparatus in which local temperature rise in the outer peripheral part of the to-be-processed substrate can be suppressed.

Means of Solving the Problems

In order to solve the above problems, this invention is a sputtering apparatus comprising: a vacuum chamber having disposed therein a target and a to-be-processed substrate face-to-face with each other; a shield plate for enclosing, inside the vacuum chamber, a film forming space between the target and the to-be-processed substrate; a cooling unit for cooling the shield plate. The shield plate comprises: a first shield plate part which is disposed around the to-be-processed substrate and which has a first opening equivalent in contour to the to-be-processed substrate so as to allow the to-be-processed substrate to face the film forming space. The cooling unit comprises a first coolant passage which is disposed in the first shield plate part and which has a passage portion extending all the way to the first shield plate part positioned around the first opening.

According to this invention, during film formation by sputtering the target, the coolant is caused to flow all the way to the passage portion which is present around the first opening. The first shield plate part can thus be suppressed from rising in temperature, even under the influence of heat input from the plasma. According to this arrangement, not only can the discharging of such gases be suppressed as are adsorbed water molecules and oxygen molecules from the surface of the first shield plate part, but also can be suppressed local heating of the outer peripheral part of the to-be-processed substrate which is positioned near the first opening. As a result, in case the target is made, e.g., of aluminum so as to deposit an aluminum film on the surface of the to-be-processed substrate, it becomes possible to deposit the aluminum film that is uniform in film quality.

By the way, in case the shield plate has a second shield plate part which is disposed around the target and which has a second opening equivalent in contour to the target so as to allow the target to face the film forming space, the second shield plate part gets heated by heat input from the plasma that is generated in the film forming space. Should the second opening consequently be thermally deformed so as to distort the second opening, there is a possibility that the plasma discharging becomes unstable. As a solution, preferably the cooling unit further comprises a second coolant passage which is disposed in the second shield plate part and which has a passage portion extending all the way to the second shield plate part positioned around the second opening. According to this arrangement, during film forming by sputtering the target, by causing the coolant to flow all the way (down to) that passage portion which is positioned around the second opening, the second plate part can surely be suppressed from rising in temperature even upon receipt of heat input from the plasma. It is thus possible to suppress the plasma discharging from getting unstable as a result of thermal deformation of the second opening.

In this invention, both the first and the second coolant passages may be formed as a respective single passage that is snaked in a direction toward or away from the target or the to-be-processed substrate in a radial direction passing through a center of the target or the to-be-processed substrate. According to this invention, there can advantageously be materialized an arrangement in which the temperature increase in that portion of both the first and the second shield plate portions which is respectively positioned around the first and the second openings can surely be suppressed and, as a result, local heating of the outer peripheral part of the to-be-processed substrate is suppressed.

MODES FOR CARRYING OUT THE INVENTION

Description will hereinafter be made, with reference to the drawings, of an embodiment of a sputtering apparatus of this invention based on an example in which a to-be-processed substrate is defined as a silicon wafer having a substantially circular contour (silicon wafer is hereinafter also referred to as "substrate Sw") and in which an aluminum film is formed (deposited) on a surface of the substrate Sw. In the following description, the terms denoting the direction such as "up or upper", "down or lower", and the like shall be based on the posture in which the sputtering apparatus as shown in FIG. 1 is installed.

Figure 1:
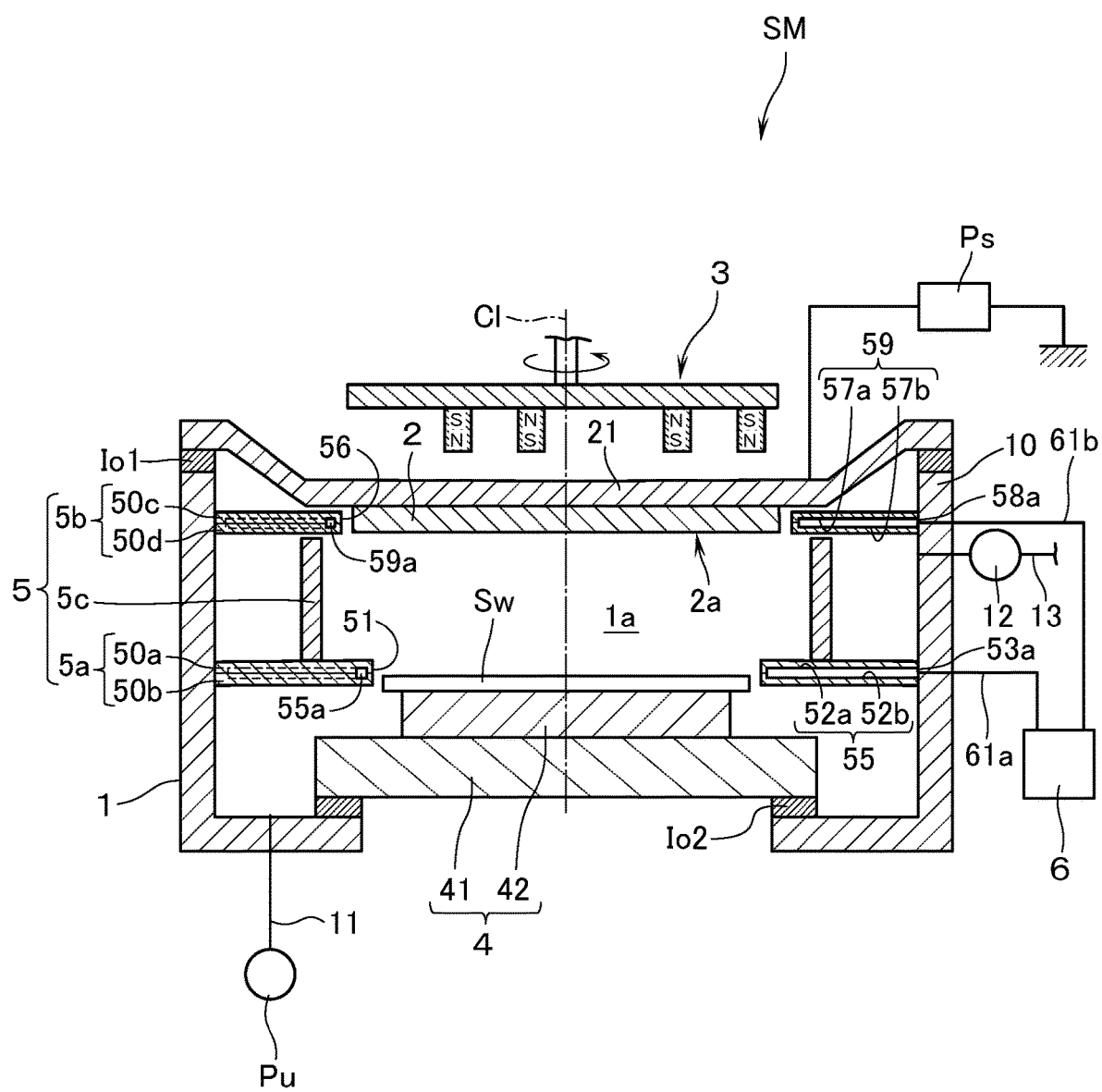
FIG. 1 is a schematic view showing a sputtering apparatus according to an embodiment of this invention.

With reference to FIG. 1, the reference mark "SM" denotes a sputtering apparatus and this sputtering apparatus SM is provided with a vacuum chamber 1. The vacuum chamber 1 has connected thereto an exhaust pipe 11 which is in communication with a vacuum pump unit Pu made up of a turbo molecular pump, a rotary pump and the like. It is possible to evacuate the vacuum chamber down to a predetermined pressure (e.g., $1 \times 10^{-5}$ Pa). Aside wall 10 has connected thereto a gas pipe 13 which has interposed therein a mass flow controller 12. It is thus possible to introduce into the vacuum chamber 1 a rare gas (e.g., argon gas) whose flow rate is controlled. At an upper part of the vacuum chamber 1, there is disposed an aluminum-made target 2 whose sputtering surface (i.e., surface to get sputtered) 2a was manufactured to correspond to the contour of the substrate Sw. In this case the upper surface of the target 2 has connected thereto a backing plate 21 in a manner that the backing plate 21 is detachably mounted, through an insulating body Io1, on a side wall 10 of the vacuum chamber 1 in a posture in which the sputtering surface 2a looks downward. The target 2 has connected thereto an output from a DC power supply Ps so that DC power with a negative electric potential can be charged to the target 2. In addition, above the target 2 there is disposed a magnet unit 3 in a manner to be rotatable about a center line Cl that passes through the center of the target 2. By the way since known art may be utilized as the DC power supply Ps and the magnet unit 3, no further detailed description will be made.

At the bottom of the vacuum chamber 1 there is disposed a stage 4 in a manner to lie opposite to the target 2. The stage 4 can hold the substrate Sw in a posture in which the film forming surface (i.e., the surface on which the film is formed) looks upward. The stage 4 has: a base support 41 made of a metal (e.g., stainless steel, classification "SUS" according to Japanese Industrial Standards, JIS) which is disposed on the lower wall of the vacuum chamber through an insulating body Io2; and a chuck plate 42 which is disposed on the base support 41 so as to contain therein an electrode for the electrostatic chuck. By charging the electrode with electric power by a chuck power supply (not illustrated), the substrate Sw can be held by suction. Alternatively it may be so arranged that the chuck plate 42 has assembled therein a heater so that the chuck plate 42 has the function of a hot plate to heat the substrate Sw to a predetermined temperature. Then, inside the vacuum chamber 1 there are disposed shield plates 5 in a manner to enclose the film forming space 1a between the target 2 and the substrate Sw.

The shield plates 5 are made, e.g., of a stainless steel (SUS) and are made up of: a first shield plate part 5a; a second shield plate part 5b; and an intermediate shield plate part 5c that is disposed between the first shield plate part 5a and the second shield plate part 5c, these three different shield plate parts 5a, 5b, 5c being separable from one another. The first shield plate part 5a is provided with a first opening 51 that has a contour equivalent to that of the substrate Sw but that is slightly larger than the outside dimensions of the substrate Sw. Then, the inner peripheral part of the first opening 51 is detachably disposed substantially in parallel with the substrate Sw so as to allow the substrate Sw to face the film forming space 1a. According to this arrangement, the sputtered particles can be prevented from adhering to that wall surface parts inside the vacuum chamber 1 parts (not illustrated) which are present below the lower surface of the substrate Sw or from adhering to those parts (not illustrated) which are present therein. By the way according to this embodiment, the first shield plate part 5a is disposed such that the first opening 51 is positioned on a line of extension of the upper surface of the substrate Sw, but there is no need of limiting to the above. Instead, it is also possible to offset upward or downward out of consideration of the wrapping around of the sputtered particles or the plasma stability.

Figure 2:
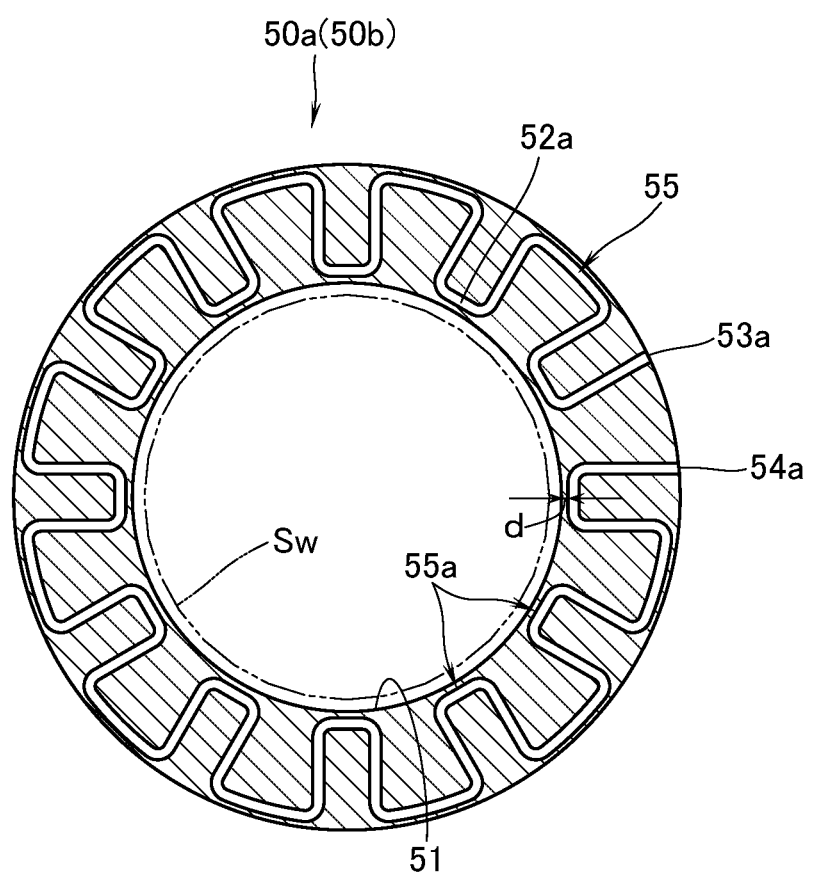
FIG. 2 is a lateral cross-sectional view explaining a first shield plate part.

In addition, the first shield plate part 5a is made by joining, e.g., two pieces of plate members 50a (50b) of the same configuration having a predetermined plate thickness. One surface of the plate members 50a (50b) is provided, as shown in FIG. 2, with petal-shaped grooves 52a (52b) in which radial recessions and projections are repeated. It is thus so arranged that both free ends of the grooves 52a (52b) reach all the way (or down) to the outside of the respective plate member 52a (52b) so that they constitute a flow inlet 53a (53b) and a flow outlet 54a (54b) of the coolant. According to this arrangement, by connecting the plate members 50a, 50b together in a posture in which each of the grooves 52a, 52b coincide with each other in the up-and-down direction, there will be formed, inside the first shield plate part 5a, a single coolant passage (a first coolant passage) 55 having a passage portion 55a which extends all the way to the portion of the shield plate part 5a positioned around the first opening 51 and which snakes in a direction toward or away from the substrate Sw. By the way, the width of the coolant passage 55, or the number of times of snaking in the direction toward or away from the substrate Sw are appropriately set by considering the coolant temperature, flow resistance, and the like so that the first shield plate part 5a can be maintained, during film forming, below a predetermined temperature. Further, description will be made of an example in which grooves 52a, 52b are formed on one of the surfaces 50a, 50b respectively but the invention shall not be limited to the above as long as the coolant passage 55 having the passage portion 55a can be formed inside the first shield plate part 5a. For example, the grooves 52a (52b) may be formed at least only on one of both the plate members 50a, 50b. On the other hand, when both the plate members 50a, 50b are coupled together, a plurality of spacers may be interposed on the surfaces to be coupled so that the clearance between both the plate members 50a, 50b that are partitioned by the spacers may serve as the coolant passage. In addition, on the surface that lies opposite to the film forming space 1a of a single piece of plate member may lie to serve as a coolant passage. As a method of mounting a first shield plate part 5a inside the vacuum chamber 1, there may be used known one such as using engaging means and the like. Therefore, detailed description thereof is omitted here.

The second shield plate part 5b has formed therein a second opening 56 that has a contour equivalent to that of the target 2 and that is slightly larger than the outside dimensions of the target 2. Further, in order for the inner periphery of the second opening 56 to be positioned around the target 2 while keeping a predetermined clearance, the second shield plate part 5b is detachably disposed substantially in parallel with the target 2 so as to allow the target 2 to face the film forming space 1a. According to this arrangement, the sputtered particles can be prevented, to the best extent possible, from getting adhered to such parts as the backing plate 21 and the like. Although not describing by particularly illustrating, the second shield plate part 5b is also constituted, in a manner similar to the first shield plate part 5a, by coupling two plate members 50c, 50d, e.g., of the same configuration having a predetermined plate thickness. On a surface of one of the plate members 50c (50d) there are provided petal-like groove parts 57a (57b) in which radial recessions and projections are repeated. Both free ends of the groove parts 57a (57b) reach all the way to (or as far as) the outside of the plate members 50c (50d), thereby constituting an inlet 58a of the coolant and an outlet (not illustrated). According to this arrangement, when the plate members 50c, 50d are coupled in a posture in which each of the groove parts 57a (57b) is coincident, there will be formed a single coolant passage (second coolant passage) 59 which has a passage portion 59a extending to the portion of the second shield plate part 5a positioned around the second opening 56, and which snakes in a direction toward or away from the target 2. In the same manner as above, the second coolant passage 59 can also be formed in a manner other than the above. As a method of mounting the second shield plate part 5b inside the vacuum chamber 1, known art may be utilized such as the one employing engaging means and the like.

The inlet 53a and the outlet 54a of the first coolant passage 55, and the inlet 58a and an outlet (not illustrated) of the second coolant passage 59 have connected thereto pipes 61a, 61b from a chiller 6. It is thus possible to circulate a coolant such as cooling water and the like through both the first and the second passages 55, 59. At this time in order not to cause condensation on each of the first and the second shield plate parts 5a, 5b, the coolant is set at a temperature of a range, e.g., between 20° C. and 25° C. In this embodiment, each of these first and the second coolant passages 55, 59 and the chiller 6 constitute the claimed cooling unit. The intermediate shield plate part 5c is constituted by forming a plate member into a tube and is disposed so as to be supported by an upper surface of the first shield plate part 5a. According to this arrangement, the sputtered particles can be prevented, to the extent possible, from getting adhered to the inner surface of the side wall 10 and the constituting parts (not illustrated) which are present inside the vacuum chamber 1. In this embodiment the intermediate shield plate part 5c does not have coolant passages therein. It may however be so arranged, as in each of the first and the second shield plate parts 5a, 5b, that a coolant passage is disposed in the inside thereof to enable cooling at the time of film forming.

In film forming an aluminum film on the surface of a substrate Sw by using the sputtering apparatus SM, the following steps are taken. Namely the substrate Sw is mounted on the stage 4 inside the vacuum chamber 1. Then, once the vacuum chamber 1 has been evacuated to a predetermined pressure, argon gas is introduced into the vacuum chamber 1 at a predetermined flow rate. DC power having a negative electric potential is charged from a DC power supply Ps to the target 2. According to the above operations, plasma will be generated inside the vacuum chamber 1. By means of the argon ions ionized in the plasma, the sputtering surface 2a of the target 2 will get sputtered. The sputtered particles splashed from the sputtering surface 2a according to the cosine law will get adhered to, and deposited on, the surface of the substrate Sw, whereby an aluminum film will be formed. In this case, even if the shield plates 5 are made of stainless steel (SUS) of relatively low thermal conductivity the coolant is caused to flow as far as (down to) the passage portion 55a that is positioned in the periphery of the first opening 51. Then, even if heat input from the plasma is received, the first shield plate part 5a will be suppressed from rising in temperature. In this manner, not only can the discharging, from the surface of the first shield plate part 5a, of gases of impurities such as water molecules, oxygen molecules and the like be suppressed, but also can the local heating be suppressed at the outer peripheral part of the substrate Sw that is positioned in the neighborhood of the first opening 51. As a result, it becomes possible to form an aluminum film that is uniform in film quality on the surface of the substrate Sw. In addition, by causing the coolant to flow as far as to the passage portion 59a that is positioned in the periphery of the second opening 56, even if heat input from the plasma is received, the temperature rise of the second shield plate part 5b can be suppressed. In this manner, the thermal deformation of the second opening 56 can be suppressed, whereby the plasma discharging can be stabilized.

Next, in order to confirm the above-mentioned effects, the following experiments were made using the above-mentioned sputtering apparatus SM. In the Invention Experiment 1 the target 2 was of aluminum make of 440 mm in diameter, the shield plate 5 was of stainless steel make, and the substrate Sw was of silicon wafer of 300 mm in diameter (TS distance was 60 mm). Then, the distance d between the passage portion 55a of the first coolant passage 55 and the first opening 51 was set to be 3 mm. After having evacuated the vacuum chamber 1 to a predetermined vacuum, argon gas was introduced into the vacuum chamber 1 at a flow rate of 50 sccm (total pressure in the vacuum chamber 1 was 0.6 Pa). DC power of 20 kW was charged from the DC power supply Ps to the target 2. For the period of a predetermined time (120 sec), the target 2 was sputtered to form an aluminum film on the surface of the substrate Sw. Then, after having finished the formation of the film on one piece of substrate Sw, the substrate Sw was exchanged to another one, thereby depositing the aluminum film on the next substrate Sw on the above-mentioned conditions. These operations were repeated for a plurality of times.

Figure 3:
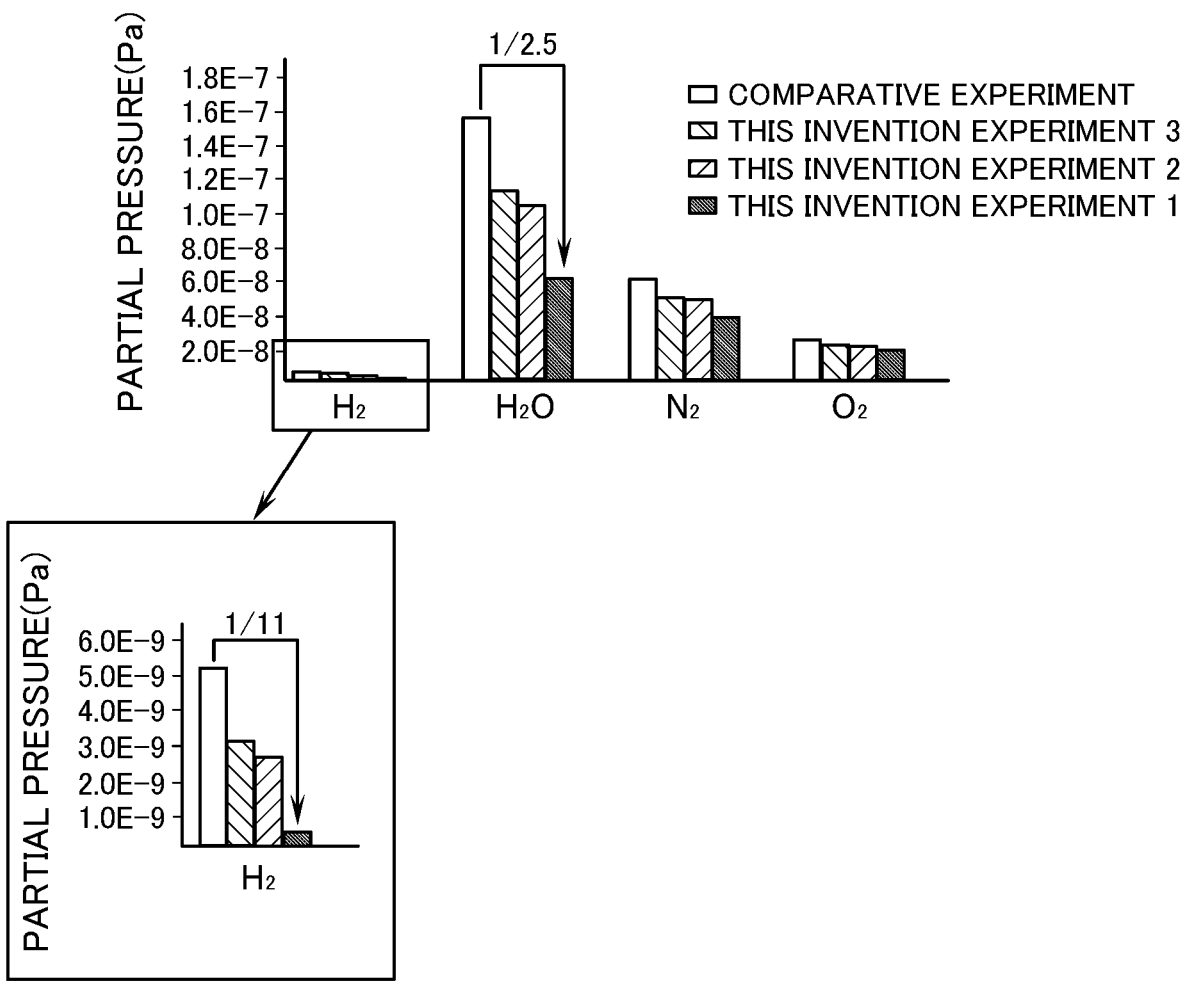
FIG. 3 is a graph showing the results of experiments to confirm the effects of this invention.

During film forming inclusive of the time of exchanging the substrates Sw, the cooling water of 20° C. was circulated by the chiller 6 to each of the first and the second coolant passages 55, 59 at a flow rate of 3.5 L/min. Also the temperature was measured, by a thermocouple, of the portion in the periphery of the first opening 51 of the first shield plate part 5a. By the way as comparative experiments, at the time when aluminum film was formed on similar conditions as those of the above-mentioned Invention Experiment 1, an experiment was carried out by not circulating the coolant through each of the first and the second coolant passages 55, 59. According to this, in the Comparative Experiment, as the time gets longer, the portion in the periphery of the first opening 51 was increased in temperature, reaching as high as maximum 250° C. On the other hand, in the Invention Experiment 1, it has been confirmed that the portion in the periphery of the first opening 51 was maintained below 40° C. In addition, during film forming, measurements were made, by a mass spectrometer, of partial pressures of impurities (hydrogen molecules, water molecules, nitrogen molecules, oxygen molecules). As shown in FIG. 3, in the Invention Experiment 1, it has been confirmed that the partial pressures of impurities could be reduced as compared with the Comparative Experiment. In particular, it has been confirmed that the partial pressure of hydrogen molecules could be reduced to 1/11, and that the partial pressure of water molecules could be reduced to 1/2.5. In addition, in the Invention Experiment 1, it has been confirmed that an aluminum film that is uniform in film quality could be formed on the surface of the substrate Sw. By the way as the Invention Experiment 2, the cooling water was circulated only through the first coolant passage 55, and as Invention Experiment 3, the cooling water was circulated only through the second coolant passage 59, aluminum films were formed on similar conditions as those of the above-mentioned Invention Experiment 1. It has then also been confirmed that the partial pressures of the impurities could be reduced as compared with the Comparative Experiment (see FIG. 3). Then, as another Invention Experiment, the electric power charged to the target 2 was increased to 30 kW. It has then been confirmed that the portion in the periphery of the first opening 51 could be maintained below 45° C.

Descriptions have so far been made of the embodiments of this invention, but various modifications are available within a range not departing from the technical idea of this invention. In the above-mentioned embodiments, description was made of an example in which an aluminum film was formed. Without being limited to the above, this invention can similarly be applicable to forming metallic compound films such as titanium films or metallic compound films such as titanium nitride films. In the above-mentioned embodiments, descriptions were made of examples in which each of the first and the second coolant passages 55, 59 were respectively constituted by a single passage. However, as long as the portions in periphery of each of the first and the second openings 55, 59 of each of the first and the second shield plate parts 5a, 5b can be cooled, there is no limit to the number of passages. For example, each of the coolant passages 55, 59 may be constituted by a plurality of (e.g., two) passages. Further, in the above-mentioned embodiments, a description was made of an example in which the shield plates 5 were divided into the first shield plate parts 5a, the second shield plate parts 5b, and the intermediate shield plate parts 5c. It may alternatively be formed integrally or, as long as the function as the deposition prevention plate is not impaired, the shape of the first shield part 5a and the second shield plate parts 5b need not be limited to the above.

EXPLANATION OF REFERENCE CHARACTERS

SM sputtering apparatus
Sw substrate (to-be-processed substrate)
1 vacuum chamber
1a film forming space (film deposition space)
2 target
shield plate
5a first shield plate part
5b second shield plate part
51 first opening
55 first coolant passage (constituting elements of cooler unit)
55a passage portion positioned around the first opening
56 second opening
59 second coolant passage (constituting element of cooler unit)
59a passage portion positioned around the second opening
6 chiller (constituting element of cooler unit)

What is claimed is:
1. A sputtering apparatus comprising:
a vacuum chamber having disposed therein a target and a to-be-processed substrate face-to-face with each other;
a shield plate for enclosing, inside the vacuum chamber, a film forming space between the target and the to-be-processed substrate;
a cooling unit for cooling the shield plate,
wherein the shield plate comprises: a first shield plate part which is disposed in parallel with the to-be-processed substrate in a manner to be positioned around the to-be-processed substrate, the first shield plate part having a first opening equivalent in contour to the to-be-processed substrate so as to allow the to-be-processed substrate to face the film forming space, and
wherein the cooling unit comprises a first coolant passage which is disposed in the first shield plate part and which has a passage portion extending to a portion of the first shield plate part, the portion of the first shield plate part being positioned around the first opening, and
wherein the first coolant passage is formed as a single passage which repeatedly snakes toward or away relative to the to-be-processed substrate in a direction passing through the center of the to-be-processed substrate.

2. The sputtering apparatus according to claim 1, wherein the first coolant passage is formed in parallel with the to-be-processed substrate and the first shield plate part.

3. The sputtering apparatus according to claim 1, wherein the first coolant passage is formed in a same plane as the first shield plate part.

4. The sputtering apparatus according to claim 1, wherein the shield plate has a second shield plate part which is disposed in parallel with the target in a manner to be positioned around the target, the second shield plate having a second opening equivalent in contour to the target so as to allow the target to face the film forming space, wherein the cooling unit further comprises a second coolant passage which is disposed in the second shield plate part and which has a passage portion extending to a portion of the second shield plate part, the portion of the second shield plate part being positioned around the second opening, and wherein the second coolant passage is formed as a single passage which repeatedly snakes toward or away relative to the to-be-processed substrate in a direction passing through the center of the to-be-processed substrate.

5. The sputtering apparatus according to claim 4, wherein the second coolant passage is formed in parallel with the to-be-processed substrate and the second shield plate part.

6. The sputtering apparatus according to claim 4, wherein the second coolant passage is formed in a same plane as the second shield plate part.

* * * * *